United States Patent [19]
Bustamante

[11] Patent Number: 5,760,554
[45] Date of Patent: Jun. 2, 1998

[54] SELECT POSITIONING POWER WINDOW SWITCH

[76] Inventor: James M. Bustamante, 1750 N. Gulley, Dearborn, Mich. 48128

[21] Appl. No.: 667,143

[22] Filed: Jun. 20, 1996

Related U.S. Application Data

[60] Provisional application No. 60/000,354 Jun. 20, 1995.

[51] Int. Cl.⁶ ............................................. H02P 1/00
[52] U.S. Cl. ............................................. 318/280; 49/140
[58] Field of Search ........................ 318/280–300; 49/139–140, 502, 280, 349

[56] References Cited

U.S. PATENT DOCUMENTS

| | | |
|---|---|---|
| 3,200,304 | 8/1965 | Atkins et al. . |
| 3,200,306 | 8/1965 | Atkins et al. . |
| 3,275,897 | 9/1966 | Atkins . |
| 3,641,410 | 2/1972 | Vogelsberg . |
| 4,071,689 | 1/1978 | Talmage et al. . |
| 4,119,864 | 10/1978 | Petrizio . |
| 4,123,631 | 10/1978 | Lewis . |
| 4,136,291 | 1/1979 | Waldron . |
| 4,161,766 | 7/1979 | Castleberry et al. . |
| 4,233,522 | 11/1980 | Grummer et al. . |
| 4,237,386 | 12/1980 | Instance . |
| 4,278,922 | 7/1981 | Grebe . |
| 4,323,829 | 4/1982 | Witney et al. . |
| 4,438,972 | 3/1984 | Katayama et al. . |
| 4,758,735 | 7/1988 | Ingraham ........................ 307/116 |
| 4,764,717 | 8/1988 | Tucket et al. . |
| 4,806,709 | 2/1989 | Evans . |
| 5,153,572 | 10/1992 | Waldron . |
| 5,329,163 | 7/1994 | Satoh et al. . |

*Primary Examiner*—David S. Martin
*Attorney, Agent, or Firm*—Gifford, Krass, Groh, Sprinkle, Patmore, Anderson & Citkowski,P.C.

[57] ABSTRACT

The invention relates generally to a system for opening or closing windows and other apertures having a plurality of conditions ranging from fully open to fully closed. The system includes a panel which is moved over an aperture by a movement mechanism, and an electrical switch having a plurality of touch positions, with the switch in electrical communication with the movement mechanism. Each touch position corresponds to an aperture condition from fully opened to fully closed. Upon actuation of one of the touch positions, the panel is moved to a particular position corresponding to the touch position actuated.

10 Claims, 4 Drawing Sheets

5,760,554

1

SELECT POSITIONING POWER WINDOW SWITCH

RELATED APPLICATION

This application claims the benefit of U.S. Provisional Application Ser. No. 60/000,354, filed Jun. 20, 1995.

FIELD OF THE INVENTION

This invention relates generally to power windows or other apertures, and, more particularly, to a system including a switch having a plurality of positions corresponding to a plurality of aperture open/close conditions.

BACKGROUND OF THE INVENTION

Automobiles have many electrically actuated devices which require a user to hold the actuating switch "on" until the device has reached the desired position. For example, to lower or raise a power window, a driver or passenger must actuate the power window switch and continue to hold the switch in the actuated position until the window has reached the desired position. Some switches enable a driver to move a switch to a position wherein the window is automatically moved to the fully lowered position or the fully raised position. Such a device is disclosed in U.S. Pat. No. 5,329,163 to Satoh et al, which discloses a pivotable power window switch for use in an automobile which permits a user to pivot the switch and place it in an "automatic" mode. In this mode, the switch continues to actuate the window motor until the glass panel reaches its fully lowered or fully raised position. The switch disclosed in Satoh et al does not permit a driver or passenger to move the glass panel to a position other than the fully lowered or fully raised position with a single, momentary contact. Additionally, it is desirable to minimize moving parts within a switch to reduce opportunities for switch failures.

Switches with quick actuation times which require minimal user interaction are preferable, and in automotive applications in particular, it is highly inconvenient for a driver to maintain contact with a switch to properly position a window or other aperture.

SUMMARY OF THE INVENTION

The present invention relates generally to a system for opening or closing a window or other aperture to a plurality of conditions ranging from fully open to fully closed. Broadly, the system includes a panel which is moved over an aperture by a movement mechanism, and an electrical switch having a plurality of touch positions, the switch in electrical communication with the movement mechanism. Upon actuation of one of the touch positions, the panel is moved to a particular position corresponding to the touch position actuated such that the aperture is within the range of aperture conditions from fully open to fully closed. The touch positions are preferably arranged on a switch convenient to the user, and may present discrete touch positions corresponding to discrete aperture open/closed positions or, alternatively, a continuum of touch positions.

In one embodiment, an elongated continuous input pad is provided with a continuum of touch positions, each position being associated with a corresponding aperture condition between fully opened and fully closed. In the preferred embodiment, the touch position in the middle of the switch is associated with a half-closed aperture condition.

In the preferred embodiment, actuation of a touch position is accomplished by a momentary contact.

2

Other objects, advantages and applications of the present invention will be made clear by the following detailed description of a preferred embodiment of the invention. The description makes reference to drawings in which:

DETAILED DESCRIPTION OF THE INVENTION

Figure 1:
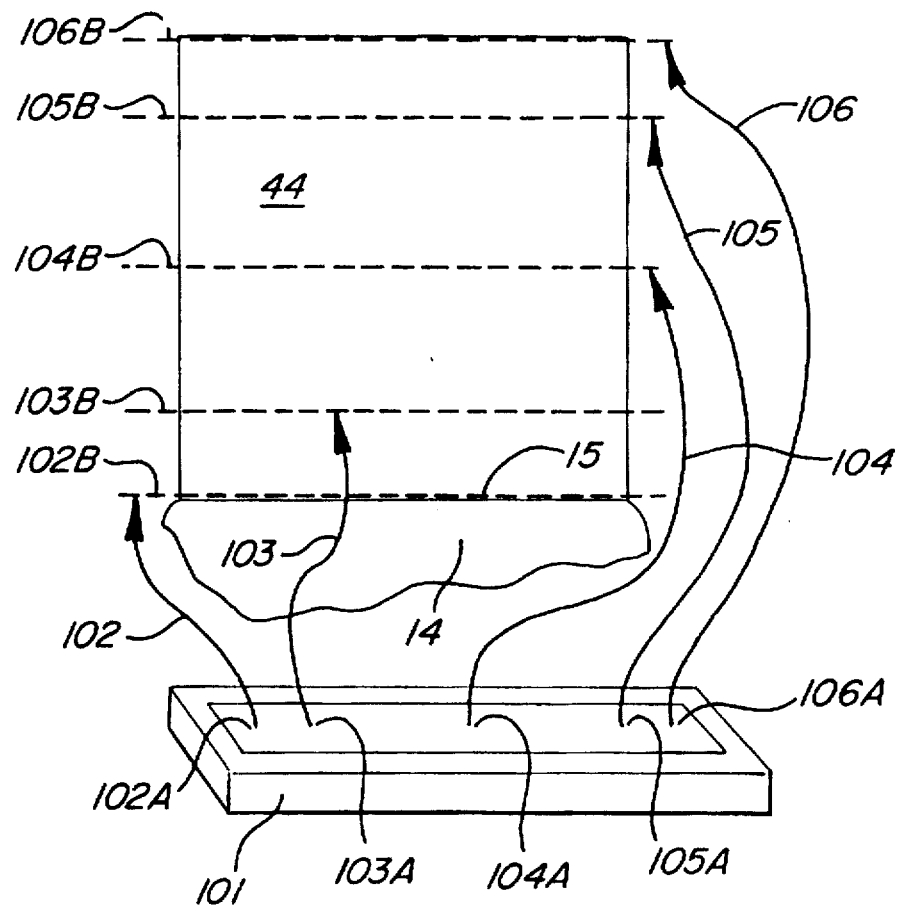
FIG. 1 is a diagrammatic view of the preferred embodiment of the switch, aperture and panel positions.
Figure 2:
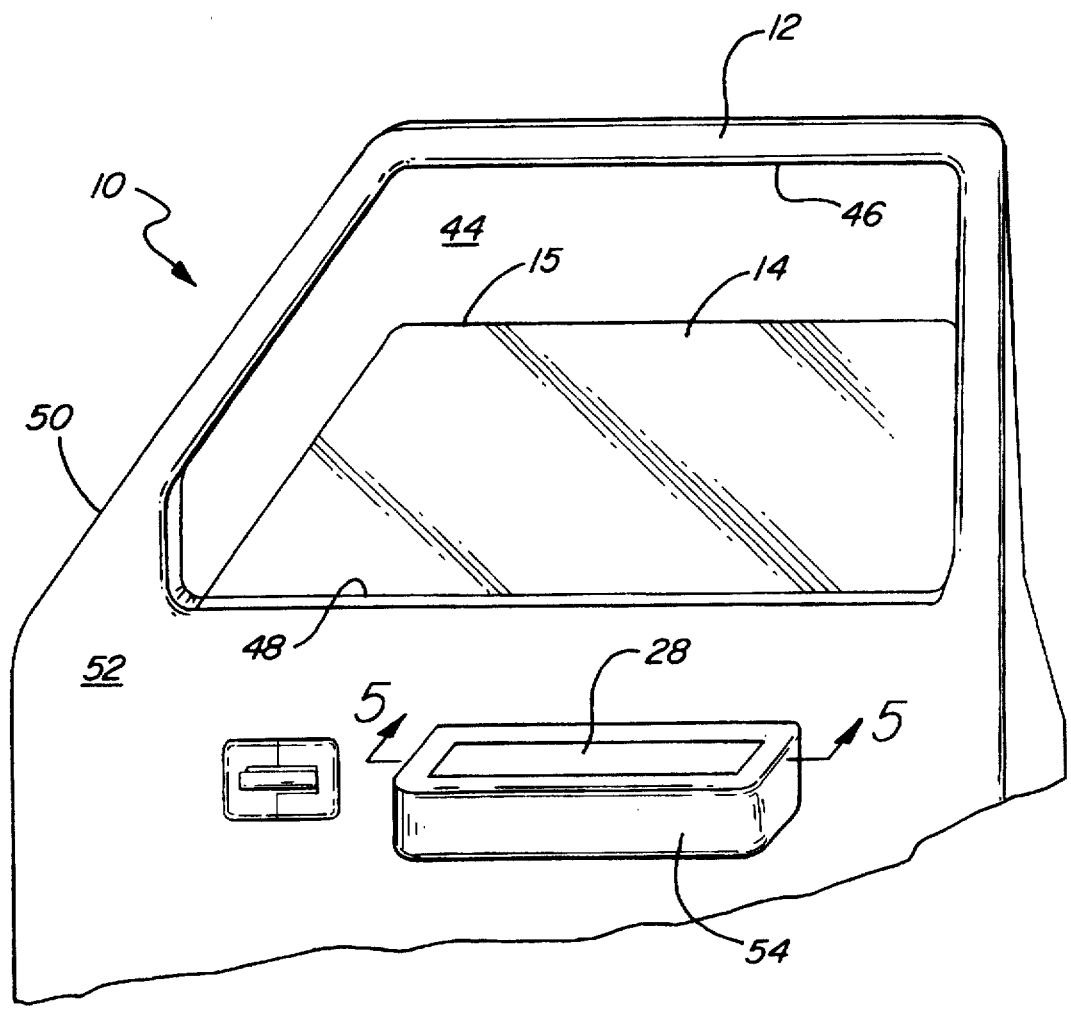
FIG. 2 is a perspective view of the interior of a vehicle's passenger door, switch and window.

The present invention relates to a system for opening and closing an aperture such as an automobile window or sunroof. The preferred embodiment of the present invention is depicted in FIG. 1, which shows an aperture 44, upper edge 15 of panel 14 and switch 101 having a plurality of touch positions. Panel 14 is positionable over aperture 44 such that aperture 44 has a plurality of conditions ranging from fully open to fully closed. Arrows 102–106 each indicate a particular touch position and corresponding aperture condition. Upon actuation of touch position 102A, the aperture is fully opened, and panel 14 is moved by a movement mechanism (not shown in FIG. 1) such that the upper edge 15 of panel 14 is aligned with panel position 102B, indicated by dotted line. Similarly, upon actuation of touch position 103A, panel 14 is moved to position such that upper edge 15 is aligned with dotted line 103B. Actuation of touch position 104A moves upper edge 15 of panel 14 to line 104B, and actuation of touch position 106A moves upper edge 15 of panel 14 to its uppermost position 106B such that aperture 44 is in its fully closed condition. FIG. 2 shows an environment within which the present invention may be used, including an automobile door 50 having an aperture 44 and interior door pad 52. Door 50 includes a frame 12 surrounding aperture 44, frame 12 including an upper edge 46 and a lower edge 48.

Figure 3:
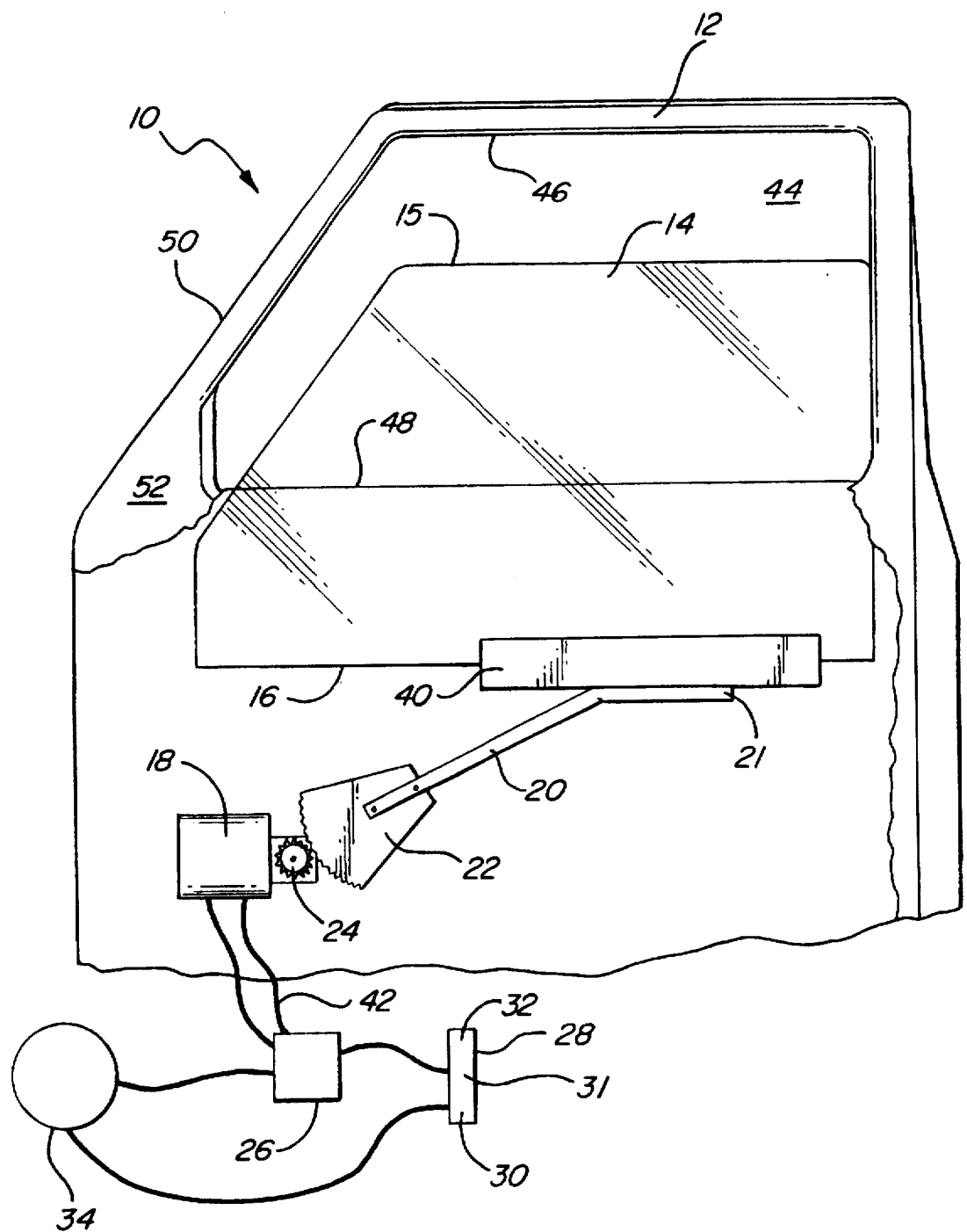
FIG. 3 is a perspective view of the passenger door depicted in FIG. 2, with door pad 52 partially cut away.

A transparent glass panel 14 is slidably received in frame 12 of door 50. As best shown in FIG. 3 where interior panel 52 is partially removed, panel 14 has an upper edge 15 and a lower edge 16. Panel 14 is slidable within frame 12 of door 50 such that aperture 44 is in a fully closed condition when panel 14 is raised so that panel edge 15 is positioned above upper edge 46 and seated within door 50. Aperture 44 is in a fully open condition when panel 14 is lowered into door 50 so that edge 15 is positioned below lower edge 48.

Panel 14 may be raised and lowered by a variety of movement mechanisms. In the preferred embodiment depicted in FIG. 3, lower edge 16 of panel 14 is seated within and attached to channel 40, which is, in turn, attached to arm 20 via a sliding joint at 21. Arm 20 is attached to toothed plate 22 (teeth not shown), which meshes with drive pinion 24 of window motor 18. Plate 22 and motor 18 are preferably attached to door 50 by bolting the motor 18 and plate 22 to a metal sheet (not shown) and attaching the metal sheet to door 50. Other drive mechanisms may be utilized with the present invention.

In the preferred embodiment, switch 101 has more than three touch positions and actuates the panel movement mechanism. In the embodiment depicted in FIG. 3, switch 101 is divided into two separate elements—an electrical power switch 26 and an input pad 28 having at least three touch positions. The touch positions along input pad 28 correspond to aperture conditions ranging between fully opened and fully closed.

As depicted in FIG. 3, power switch 26 is electrically connected to motor 18 and power source 34. Input pad 28 having a surface 31 is electrically connected to power switch 26. Input pad 28 has a continuum of touch positions along surface 31 and is placed within the vehicle so as to permit a user to conveniently access the touch positions.

Figure 5:
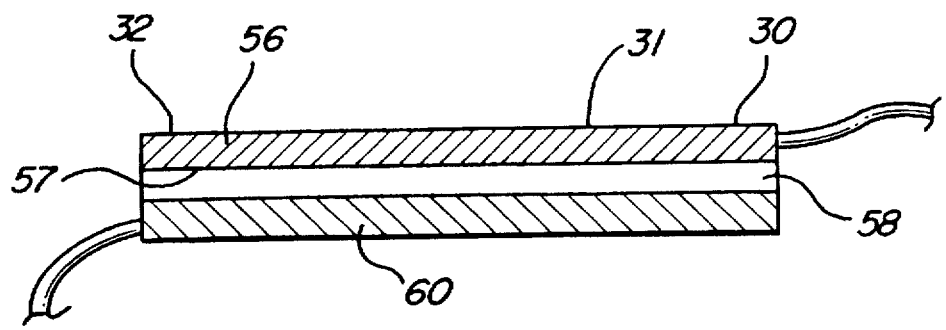
FIG. 5 is a cross-sectional view of the embodiment of the switch depicted in FIG. 1.

In the cross-sectional view of input pad 28 depicted in FIG. 5, input pad 28 comprises, in the preferred embodiment, three layers; a flexible conductive membrane 56, an air gap 58 and a resistor 60. Membrane 56 has a lower conductive surface 57 which is electrically connected to power source 34. The upper surface of membrane 56 is surface 31 of input pad 28. Resistor 60 is preferably made of impregnated carbon and is electrically connected to switch 26.

When the user depresses a touch position on surface 31, flexible membrane 56 is depressed, causing conductive layer 57 to traverse air gap 58 and contact resistive layer 60, thereby completing a circuit and sending a resultant signal to switch 26. The resultant signal is determined by the position at which conductive layer 57 contacts the resistive layer 60 along its length. Each touch position along the continuum of touch positions of input pad 28 will generate a unique resultant signal due 30 to the variation of resistance in the circuit between flexible conductive layer 57 and resistive layer 60.

In alternate embodiments, a capacitive element may be used in place of the resistive layer 60 or other known switch technologies may be utilized to create a unique signal for each touch position along the continuum.

An analog-to-digital converter (not shown) is positioned between power switch 26 and input pad 28 so that the resultant signal sent to power switch 26 is converted prior to being received by power switch 26. Power switch 26 preferably includes a microprocessor within which is stored a set of outgoing signals which correspond to the possible range of resultant signals which input pad 28 may generate. Power switch 26 receives the resultant signal, determines which outgoing signal corresponds to the resultant signal, and sends the outgoing signal to window lift motor 18, which is actuated by the outgoing signal from the switch. Motor 18 then raises or lowers glass panel 14 within frame 12 to the position which corresponds to the touch position contacted by the user.

In the preferred embodiment, motor 18 also includes a microcontroller which senses the position of panel 14, and, upon receipt of the outgoing signal from power switch 28, compares the position of panel 14 with the desired position of panel 14 and moves panel 14 to the desired position. In alternate embodiments, motor 18 may merely feed back to power switch 26 the current position of panel 14, and the microcontroller in power switch 26 may compare the current and desired positions of panel 14 and send an appropriate signal to motor 18 to cause motor 18 to move panel 14 to the desired position.

In the preferred embodiment, a user touches surface 31 at a touch position along the continuum to adjust panel 14 within frame 12 so as to achieve a particular aperture condition. When the user wishes to lower panel 14 such that aperture 44 is in its fully opened condition, the user actuates touch position 30, as best seen in FIG. 3. When the user wishes to raise panel 14 such that aperture 44 is in its fully closed condition, the user actuates touch position 32. If the user wishes to position panel 14 such that aperture 44 is half-closed, the user touches the touch position half-way between touch positions 32 and 30. If the user wishes to position panel 14 such that aperture 44 is three-quarters closed, the user touches surface 31 of input pad 28 at a touch position three-quarters of the distance from touch position 30 to touch position 32.

Figure 4A:
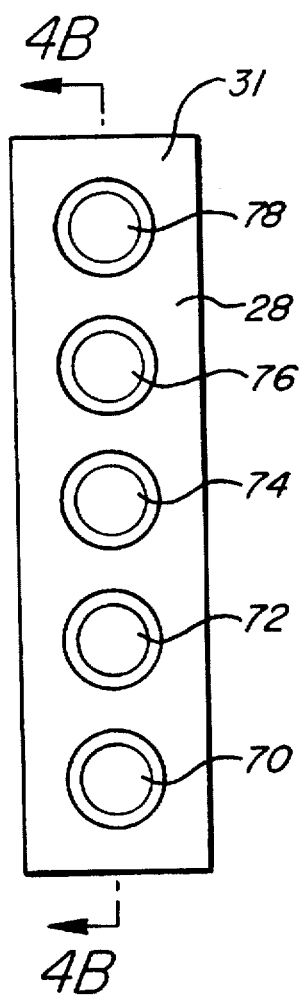
FIG. 4A is top view of an alternate embodiment of the switch having a discrete number of touch positions.
Figure 4B:
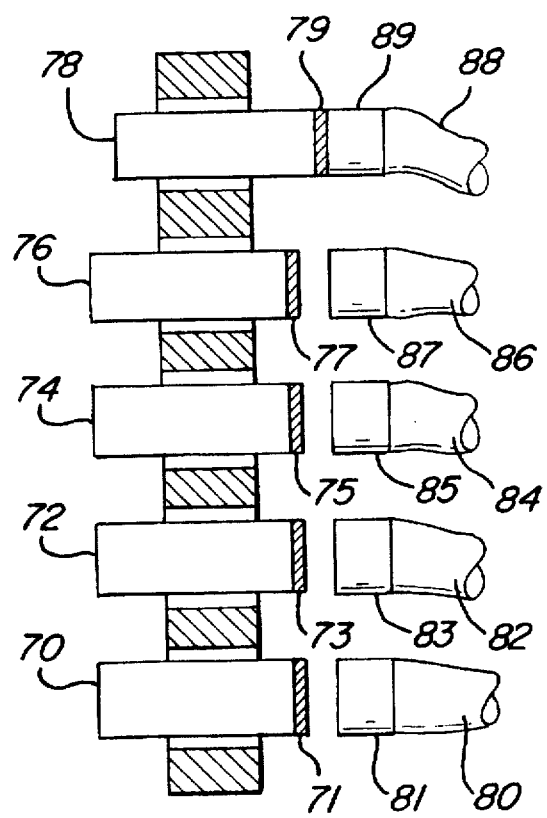
FIG. 4B is a cross-sectional view of the embodiment depicted in FIG. 4A.

In alternate embodiments, a discrete number of touch positions may be utilized, such as depicted in FIGS. 4A and 4B, wherein each touch position is a discrete button. As in the prior embodiment, depressing button 78 sends a signal to power switch 26 which actuates motor 18 to raise panel 14 to its highest position whereby aperture 44 is in its fully closed condition. Depressing button 70 sends a signal to switch 26 which actuates motor 18 to lower panel 14 to its lowest position whereby aperture 44 is in its fully open condition. Correspondingly, depressing button 74 results in a half-closed aperture condition, depressing button 72 results in an three-quarter open aperture condition, and depressing button 76 results in a three-quarter closed aperture condition.

In embodiments utilizing discrete input sites, an odd number of input sites is preferred, with at least three input sites being used. This permits a user to select a "half-way" setting of aperture 44.

A variety of configurations known to those skilled in the art may be utilized to enable a depressed button to close a circuit, thereby sending an electrical signal to a switch. In the preferred embodiment, buttons 70, 72, 74, 76 and 78 each have, at their lower ends, an electrically conductive pad 71, 73, 75, 77 and 79 30 respectively, each pad being attached to power source 34 (attachment not shown). The electrically conductive pads 71, 73, 75, 77 and 79, upon depression of their respective buttons, come into electrical contact with electrically conductive terminals 81, 83, 85, 87 and 89, respectively. Terminals 81, 83, 85, 87 and 89 are mechanically and electrically connected to wires 80, 82, 84, 86 and 88 respectively, and each wire is connected at its other end (not shown) to switch 26. As button 78 is depressed, pad 79 contacts terminal 89 which operates to close a particular circuit, thereby sending a distinct signal to switch 26 which in turn sends a signal to motor 18 to move panel 14 to a position corresponding to button 78 which, in the embodiment depicted in FIG. 4B, results in a fully closed aperture condition.

Terminals 81, 83, 85, 87 and 89 and pads 71, 73, 75, 77 and 79 may be configured in a variety of ways to enhance the level of electrical contact between a given terminal and pad, such as forming each terminal as a female contact such as a sleeve and forming each pad as a male pin which is received within the female sleeve.

A plurality of input pads 28 may be positioned on a driver's door armrest which permit the driver to control the condition of all apertures within the vehicle, such as front and rear windows and a sunroof.

An alternate embodiment of the invention permits controlling all apertures within a vehicle via a single master switch such as switch 101, permitting the driver to move all window panels in the vehicle to the same position at the same time. The master switch may include toggle means which sends a signal to the microprocessor within the switch indicating that the window position selected via the actuated touch position is to be applied to all window panels simultaneously. The microprocessor within switch may then proceed to actuate all window lift motors within the vehicle, causing movement of all window panels to the appropriate positions. Currently available switch technology may be utilized to construct this embodiment of the present invention in a variety of ways.

The switch could also include various safety features, such as a "lock out" feature, such that the vehicle's windows are operable only from the driver's master switch, which prevents young passengers in rear seats from operating the rear windows.

Additionally, the switch could include a feature which prevents the window from closing on an object which is in the path of travel of the glass panel. For example, a load monitor may be placed between the lower edge of the glass and the channel, and upon sufficient load being placed upon the window in the downward direction, the switch would stop the window motor. In this manner, an obstruction in the path of the glass would not be trapped between the frame 12 and glass panel 14.

Another preferred embodiment of the system of the present invention includes opening or closing a sunroof utilizing the switch 101, movement mechanism and power source as described above.

Figure 6:
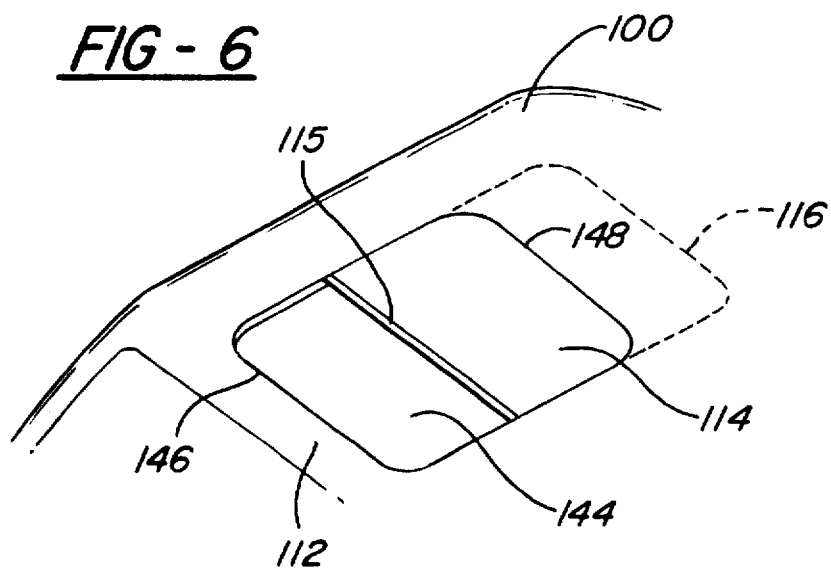
FIG. 6 is a perspective view of a sunroof for use with the present invention.

As depicted in FIG. 6, a roof 100 is shown having a sunroof aperture 144 formed therein. Roof 100 forms a frame 112 around the center roof aperture 144. Frame 112 has a forward edge 146 and rearward edge 148. Slidably received within frame 112 is sunroof panel 114, having forward edge 115 and rearward edge 116. Panel 114 is slidable within frame 112 by a variety of mechanisms, such as rack and pinion, or track and roller. The movement mechanism selected is electrically connected to a power source and switch 101.

The sunroof depicted in FIG. 6 operates in a similar manner as the window depicted in FIGS. 1 and 3, such that each touch positions is associated with a sunroof aperture condition. The fully opened condition for aperture 144 occurs when forward edge 115 of frame 112 is positioned below rear edge 148 of frame 112, and corresponds to a touch position at one end of the continuum of touch positions. Sunroof aperture 144 is in its fully closed condition when forward edge 146 is seated within forward edge of frame 112, and corresponds to a touch position at the other end of the continuum of touch positions. As touch position are selected, sunroof panel 114 is moved to a position between the fully opened and fully closed conditions of aperture 144 which corresponds to the relative position of the touch position selected along the continuum.

While the system of the present invention may be "factory installed" in a vehicle, the system may be retrofitted to existing window and sunroof systems.

The method of the present invention includes providing a continuim of touch positions in a location readily accessible by a user. Each touch position is associated with a window position, such that, upon actuation by the user of a particular touch position, the window is moved to the window position associated with the actuated touch position.

Having described the various embodiments of the present invention with reference to the accompanying figures, it will be appreciated that various changes and modifications can be made without departing from the scope or spirit of the invention.

I claim:

1. A system for adjusting the position of a power window having a plurality of positions between fully opened and fully closed, comprising:

an electrical power source;

a window movement mechanism which moves the window between window positions;

an elongated, continuous input pad in electrical communication with the power source and window movement mechanism, the pad having a continuum of touch positions, each touch position along the continuum being associated with a window position, whereby upon actuation of one of the touch positions, the window is moved to the associated window position.

2. The system of claim 1 having at least three touch positions.

3. The system of claim 1 having discrete touch positions.

4. A system for opening or closing an aperture having a plurality of conditions ranging from fully open to fully closed, the system comprising:

a frame;

a panel slidably received in the frame;

an electrical power source;

a panel movement mechanism;

attachment means mechanically connected to the panel and panel movement mechanism so that, upon actuation of the panel movement mechanism, the panel is moved within the frame;

an elongated continuous input pad having a continuum of touch positions in electrical communication with the power source and panel movement mechanism so that, upon actuation of a first touch position at one end of the pad, the input pad sends a signal to the panel movement mechanism, causing the panel movement mechanism to adjust the panel within the frame so that the aperture is in its fully open condition a upon actuation of a touch position at an opposite end of the pad, the input pad sends a signal to the panel movement mechanism, causing the panel movement mechanism to position the panel within the frame so that the aperture is in its fully closed condition and actuation of each position on the pad between its ends causes the panel movement mechanism to position the pad within the frame to create an aperture condition analogous to the relative position of the touch position wherein actuation of the touch position is accomplished by a momentary along the input pad.

5. The system of claim 4, wherein the aperture is a sunroof.

6. The system of claim 4, wherein the aperture is a window.

7. The system of claim 6, wherein the panel is transparent.

8. The system of claim 6, wherein the panel movement mechanism is a window lift motor.

9. The system of claim 6, wherein the attachment means is a channel.

10. The system of claim 6, wherein the window is an automobile window.

* * * * *

UNITED STATES PATENT AND TRADEMARK OFFICE
CERTIFICATE OF CORRECTION

PATENT NO. : 5,760,554
DATED : June 2, 1998
INVENTOR(S) : James M. Bustamante

It is certified that error appears in the above-indentified patent and that said Letters Patent is hereby corrected as shown below:

Column 3, line 35, delete "30".

Column 4, Line 39, delete "30".

Column 6, line 42, delete "a" and insert --and,--

Column 6, lines 53-54, delete "wherein actuation of the touch position is accomplished by a momentary".

Signed and Sealed this

Eighth Day of September, 1998

Attest:

BRUCE LEHMAN

Attesting Officer

Commissioner of Patents and Trademarks